United States Patent [19]

Hayward

[11] Patent Number: 4,669,938
[45] Date of Patent: Jun. 2, 1987

[54] APPARATUS FOR AUTOMATICALLY LOADING A FURNACE WITH SEMICONDUCTOR WAFERS

[75] Inventor: Geoffrey Hayward, Frimley, United Kingdom

[73] Assignee: Heraeus Quarzschmelze GmbH, Hanau, Fed. Rep. of Germany

[21] Appl. No.: 912,191

[22] Filed: Sep. 25, 1986

Related U.S. Application Data

[63] Continuation of Ser. No. 724,625, Apr. 18, 1985, abandoned.

[30] Foreign Application Priority Data

Apr. 19, 1984 [GB] United Kingdom ............... 8410251

[51] Int. Cl.⁴ .................... C30B 25/12; F27B 9/20; F27D 3/00
[52] U.S. Cl. .................. 414/156; 414/589; 414/751; 432/11; 432/239; 432/253; 432/259
[58] Field of Search .......... 414/152, 156, 180, 182, 414/183, 209, 210, 214, 222, 225, 404, 589, 661–663, 751, 609; 901/6; 432/11, 121, 152, 153, 191, 239, 253, 259

[56] References Cited

U.S. PATENT DOCUMENTS

| | | | |
|---|---|---|---|
| 3,744,650 | 7/1973 | Henebry et al. | 414/156 |
| 3,811,825 | 5/1974 | Enderlein | 432/253 X |
| 4,439,146 | 3/1984 | Sugita | 414/152 X |
| 4,440,538 | 4/1984 | Bowers | 414/183 |
| 4,468,195 | 8/1984 | Sasaki et al. | 414/180 X |
| 4,505,630 | 3/1985 | Kaschner et al. | 414/152 |
| 4,516,897 | 5/1985 | Snider et al. | 432/253 X |
| 4,518,349 | 5/1985 | Tressler et al. | 432/11 |
| 4,523,885 | 6/1985 | Bayne et al. | 414/156 |
| 4,550,239 | 10/1985 | Uehara et al. | 414/404 X |
| 4,557,657 | 12/1985 | Olson et al. | 414/180 |

FOREIGN PATENT DOCUMENTS 0093504 11/1983 European Pat. Off. .
3237047 5/1983 Fed. Rep. of Germany .

Primary Examiner—Leslie J. Paperner
Assistant Examiner—David A. Bucci
Attorney, Agent, or Firm—Frishauf, Holtz, Goodman & Woodward

[57] ABSTRACT

An apparatus for loading a furnace with semiconductor wafers is known, which has at least two heat treatment chambers (1A, 1B, 1C, 1D), each of them having an associated stationary loading unit (8) with a receptacle movable in the direction of the furnace axis via a feed apparatus and having a loading system (2A, 2B, 2C, 2D) for semiconductor wafers. In order to provide such an apparatus for automatically loading the furnace with semiconductors which facilitates loading and overcomes the disadvantages of the known apparatuses, the apparatus according to the invention has a common central loading station (9) for all the semiconductor loading systems (2), and these loading systems are removable from the loading unit (8). Further, a transport device (10) is provided which is movable in two directions at right angles to one another as well as at right angles to the axis of the furnace and which has a coupling unit (12) for moving a respective loading system (2), loaded with semiconductor wafers, between the loading station (9) and the furnace loading unit (8).

13 Claims, 6 Drawing Figures

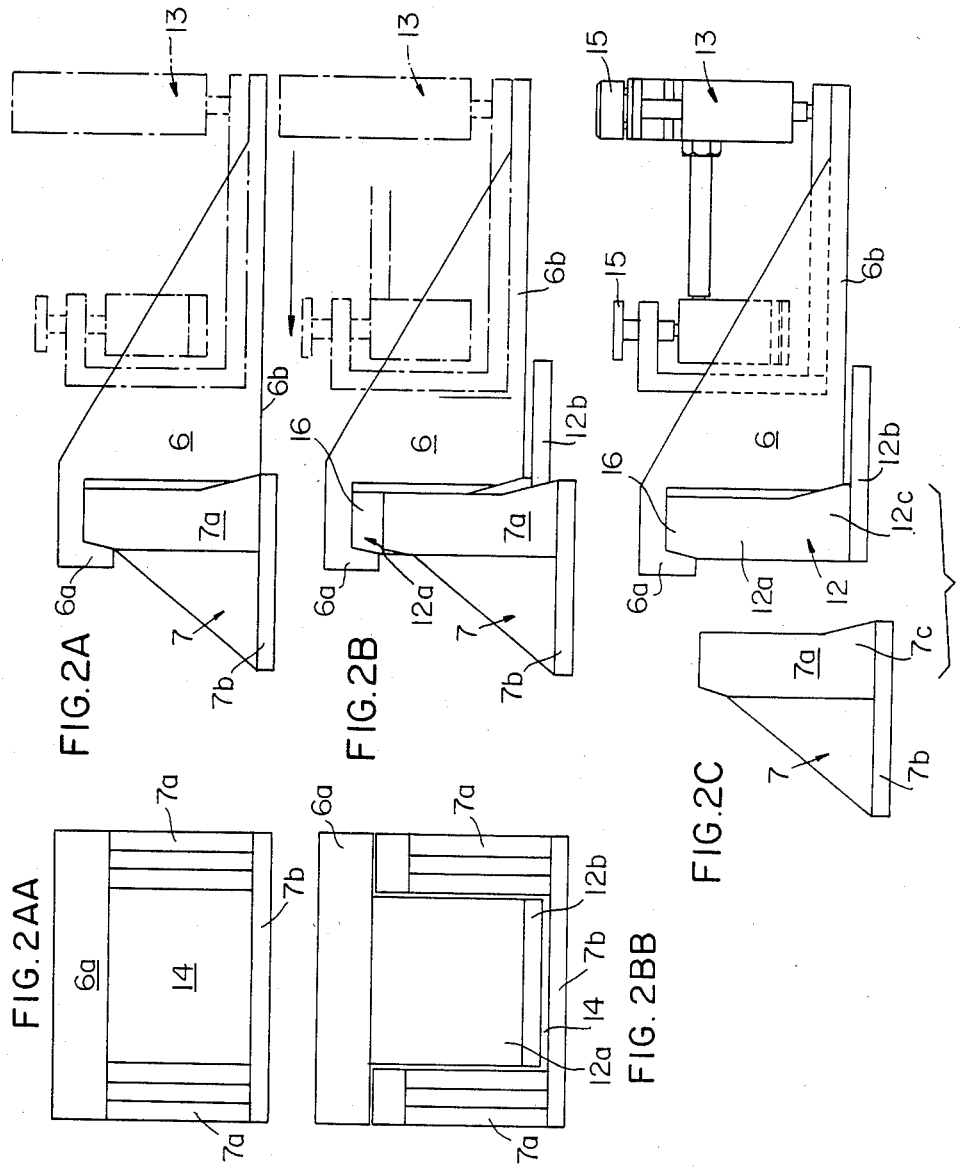

APPARATUS FOR AUTOMATICALLY LOADING A FURNACE WITH SEMICONDUCTOR WAFERS

This application is a continuation of application Ser. No. 724,625, filed 4-18-85, now abandoned.

CROSS REFERENCE

Reference to related patent, assigned to the assignee of this application, the disclosure of which is hereby incorporated by reference:
U.S. Pat. No. 4,523,885, Lambert et al.

The present invention relates to an apparatus for loading a furnace system with semiconductor wafers. The furnace system has at least two heat treatment chambers, in particular tubular chambers, and a stationary loading unit having a receptacle that can be moved via a feed mechanism in the direction of the furnace axis and that has a support system for semiconductor wafers which is associated with each heat treatment chamber.

BACKGROUND

It has already been proposed that semiconductor substrates be transported automatically into and out of heat treatment furnaces, which are generally tubular furnaces, with the aid of transport devices which feed the semiconductor substrates, contained in magazines of glass or ceramic, normally vitreous silica, horizontally into and out of the furnaces. A plurality of such tubular furnaces are often disposed in stacks one above the other, each furnace having its own loading device for the substrates.

Up to the present time, the semiconductor substrates have been conveyed manually to or from the horizontally movable transport device or loading device in order to load or unload the furnace; in other words, a human operator inserts or removes the magazines containing the semiconductor wafers one by one, with the aid of a special tool, such as a lifting fork. With increasing substrate size and hence additional weight, however, this type of operation is becoming increasingly impractical. Furthermore human operators must be kept away from the immediate vicinity of the furnace and the loading and unloading station, as much as possible, because these persons have been found to be a source of contamination, which impairs clean room conditions and reduces the efficiency of semiconductor production.

A conventional heat treatment apparatus is disclosed in German Patent Disclosure Document No. DE-OS 32 37 047 to which U.S. Pat. No. 4,468,195 corresponds. In this heat treatment apparatus, the semiconductor wafers that are to be treated, which are disposed in carriers, are fed into the tubular furnace and retrieved therefrom by using a fork, which is part of a stationary loading unit associated with each furnace. The fork can be raised and lowered for this purpose.

THE INVENTION

It is an object to provide an apparatus for automatically loading a furnace system with semiconductor wafers which facilitates loading the furnace and overcomes the disadvantages of known semiconductor wafer loading apparatuses.

Briefly, the apparatus according to the invention has a common central loading station for all the semiconductor loading systems, which are removable from the loading unit. The apparatus also has a transport device, which is movable in two directions at right angles to one another and at right angles to the axis of the furnace and which has a coupling unit for moving a respective loading system, loaded with semiconductor wafers, between the loading station and the furnace loading unit.

An important feature of the invention is that the semiconductor loading systems can be removed from the loading units and a transport device is devised that is movable in two directions, in order to deliver the loading systems to a loading station.

The device preferably comprises a plurality of tubular furnaces, disposed one above another, and each tubular furnace is associated with its own transport device, which executes the transporting movements according to the invention.

Each transport device is disposed such that it travels along a first movement direction when it is feeding substrates into the furnace or removing them for the associated furnace; means are also provided which move the transport device along a second movement direction, at right angles to the first, and which displace the transport device along a third movement direction at right angles to the first and/or second movement direction. A movement along the second and/or the third route is selected whenever magazines carrying the semiconductor substrates are to be moved from a magazine loading station into the immediate vicinity of a furnace, or returned from the immediate vicinity of a furnace back to the loading station. The transport devices advantageously each have a cantilever suspended loading system, such as that described in copending U.S. Ser. No. 483,724 now U.S. Pat. No. 4,523,885, BAYNE et al.

According to a feature of the present invention, means are provided which are capable of retracting a cantilever suspended loading system of this kind out of the immediate vicinity of the furnace and moving it to a position in which it is released from its initial suspension device and transferred to another. By means of the second suspension device, the suspended loading system can be moved at least horizontally, and possibly vertically as well, away from the immediate vicinity of the furnace at that time to a substrate transfer station, where substrates that have already been heat treated can be removed from the suspended loading system and other substrates, which have not yet been treated, can be placed on the suspended loading system. The suspended loading system can then be moved back over the same route, until it is again transferred to the loading unit suspension device, which feeds it into the furnace and retracts it back out again.

For horizontally arranged heat treatment chambers, an apparatus in which the transport device has a vertical beam on which a horizontal beam is movably disposed, and in which the coupling unit is horizontally movable on the horizontal beam, is advantageous.

According to a further feature of the invention, the loading system has a connecting head, which is adapted to be coupled to both the coupling unit and a connecting device of the loading unit. For the sake of adjustment, it is advantageous to have a suspended loading system having an alignment head, with which the inclination of the loading system relative to the axis of the furnace can be adjusted; the alignment head may be part of the connecting head.

Adjustability is achieved in a simple manner by means of an alignment head which has screw elements for adjusting the inclination of the loading system.

In an advantageous embodiment, the connecting head is a hooked element that can be hooked onto both the connecting device and the coupling unit. To this end, the connecting head may have a platform with a hooked end wall embodying the hooked part.

The apparatus becomes simple to operate by providing a coupling unit with a platform and an end wall protruding from it and having a connecting device that also has a platform and two protruding, spaced apart side pillars; the pillars form a space that is at least slightly larger than the width of the end wall of the coupling unit, so that the coupling unit can fit between the side pillars for engagement.

Good centering and secure retention is provided in that the hooked part has a tapering hook opening. For the same reason, the end wall and/or the side pillers are oblique on their upper edge that points inward, and/or, on their side pointing outward, toward the connecting head, they have a base in their lower portion that widens in the manner of a wedge toward the platform.

Further details of the invention will become apparent from the ensuing description of an exemplary embodiment, in conjunction with the drawings.

DRAWINGS

FIG. 1 is a perspective view of the apparatus according to the present invention; and FIGS. 2A, 2AA, 2BB and 2C are schematic side and end views, respectively of details of the apparatus of FIG. 1 in various stages of operation.

DETAILED DESCRIPTION

Figure 1:
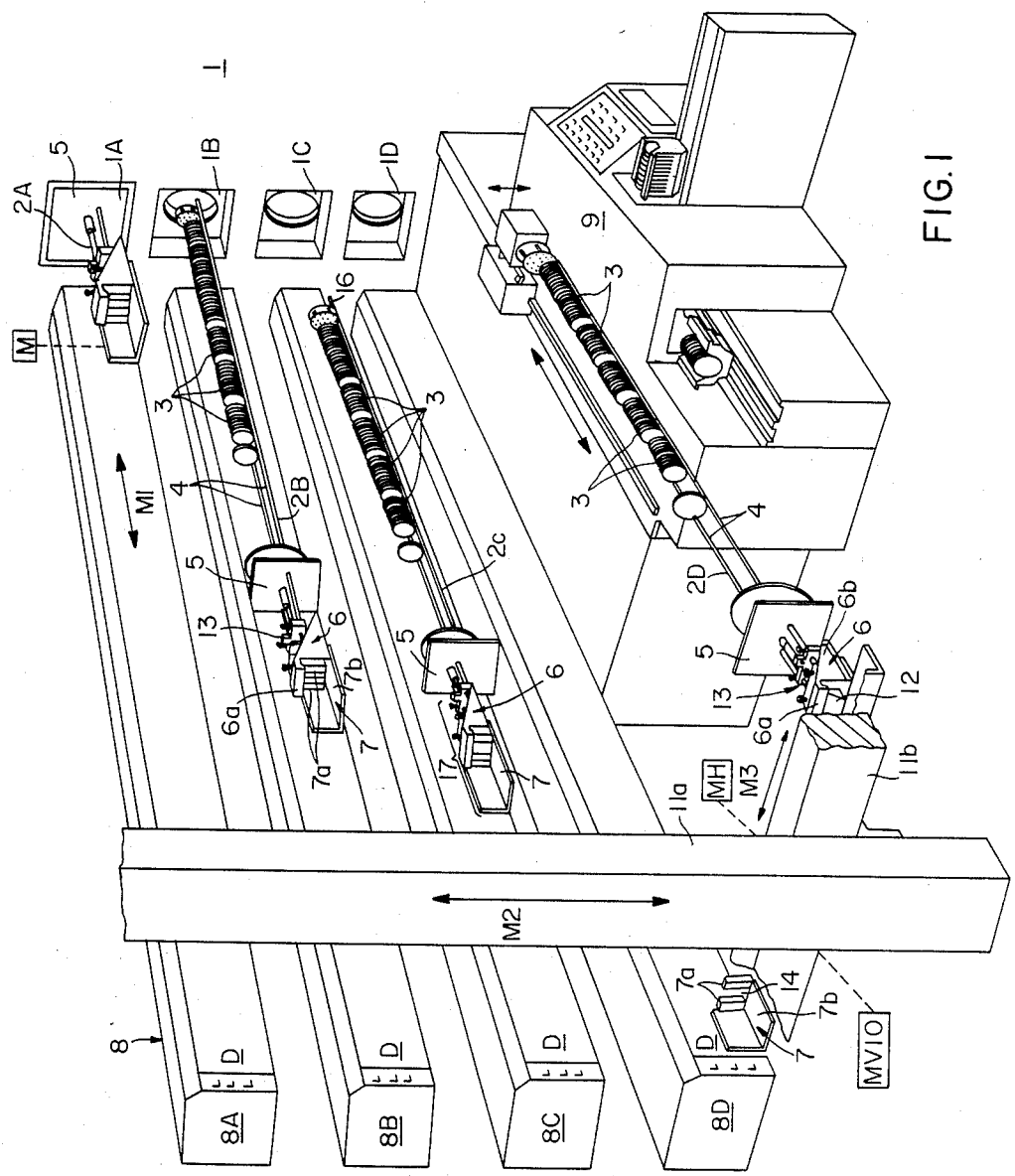

The apparatus shown in the drawing includes four vertically stacked tubular diffusion furnaces 1A, 1B, 1C and 1D. Each of them is linked and connected with an associated cantilever suspended loading system 2A, 2B, 2C and 2D, by which magazines (not visible) containing semiconductor substrates 3 are loaded into the furnaces for heat treatment and subsequently removed from the furnaces again. Each of the suspended loading systems 2, which may in principle have the structure described in our above-mentioned U.S. Pat. No. 4,523,885, has two horizontally disposed vitreous silica tubes 4, which are spaced apart from one another and parallel to one another such that they are capable of receiving a number of magazines; each magazine can receive a number of semiconductor substrates 3 that are to be heat treated, for instance 25 or 50 substrates per magazine. The silica tubes 4 envelop inner ceramic rods, and the rearward ends have a heat shield 5 and then terminate in a connecting head 6, which is detachably coupled to a connecting device 7 which includes a puller platform. The connecting device 7 can be driven horizontally back and forth along a horizontally disposed furnace loading unit having a housing 8; accordingly, the suspended loading system 2 with the substrates placed upon it for heat treatment can be fed into its associated furnace 1 and after heat treatment retracted from the furnace again by the cantilever suspended insertion system. The transport mechanism for each connecting device 7 is driven electrically and is built into the housing 8. Four housings, 8A, 8B, 8C, 8D are shown, each associated with a furnace 1A, 1B, 1C, 1D, respectively.

The apparatus also includes a substrate transfer station or mechanism 9, at which substrates that are to be heat treated can be placed in magazines located on any one of the loading systems 2, and where the magazines containing already heat treated substrates can then be unloaded again.

According to the invention, a transport device is provided which includes a vertically arranged mechanism or elevator 10 for raising and lowering a beam 11b, disposed horizontally on a vertical beam 11a. The transport device is operative between the stacked housings 8 and the substrate transfer mechanism 9. The horizontal beam 11b supports a transversely movable coupling unit 12, formed as a puller transfer support. Thus, the transfer coupling unit 12 is movable between the connecting device 7 on the loading unit 8 and the substrate loading station 9.

OPERATION

Once the heat treatment of the semiconductor substrates 3 and the furnace 1 has been completed, they are removed from the furnace by the cantilever suspended insertion systems 2 and cool down at a first waiting position of the cantilever suspended insertion system. This position is shown for system 2B. Then the cantilever suspended cooled systems 2 are moved farther back, as shown for system 2C, until they reach a transfer or docking station D, seen in FIG. 1 at the housing 8D. At this station, the connecting device 7 is at a position at the rearward end of the housing 8D; this is shown for the connecting device 7 and for the furnace 1D. The horizontal beam 11b is then raised—or lowered—to a position at which the coupling unit 12 is located in the same alignment as the connecting devices 7.

Subsequently, the loading system 2 at the station D is transferred from the connecting device 7 to the coupling unit 12, movable on beam 11b. Then, if necessary, the transport device 10 will lower the coupling unit 12, with a loading system 2 cantilever suspended thereon to the level of the central loading station 9. Thus it moves the loading system 2, which it now carries, horizontally to a position located on the loading station, as shown for system 2D; the magazines which contain the treated substrates can now be unloaded. Substrates that have not yet been heat treated are then loaded into the magazines at loading station 9 on the loading system 2.

The transport device or transfer system 10 is actuated in order to move the insertion system 2 horizontally and vertically until it has reached the location associated with its particular furnace, at the position of the connecting device 7. In this position, the cantilever suspended insertion system is transferred from the coupling unit 12 to the connecting device 7 which is associated with the corresponding furnace, so that the respective system 2 can once again be fed by the drive mechanism of the puller of the respective housing 8 into the furnace 1, where the heat treatment of the substrates is performed. The transport device 10 and the coupling unit 12 are both preferably driven electrically.

In the manner described above, the cantilever suspended insertion system 2 functions as a transport device for the semiconductor substrates that it carries, both to and from the substrate transfer mechanism 9 and also into and out of the furnace.

FIGS. 2A–2C, and the respective end views FIGS. 2AA and 2BB, show steps in the transfer of a loading system 2 between a connecting device 7 and a coupling unit 12.

Coupling unit 12 has a platform 12b. The connecting head 6 of the system 2 is used used in the transfer. As shown, partially in broken lines (FIGS. 2A-2C), the rearward end of the suspension system 2 has a clamping element in the form of an alignment head 13 having adjustment screws 15 for adjusting the alignment of the tubes 4 with respect to a given furnace. For details, see the referenced U.S. Pat. No. 4,523,885. Each alignment head 13 is mounted on a supporting platform 6b. In accordance with a feature of the invention, the head 13 has a hooked end wall 6a which, when coupled to connecting device 7, is suspended via its upper edge 7 from side pillars 7a on the connecting device 7—see also FIG. 1 at station D. The platform 12b and the end wall 12a of the coupling unit 12 are dimensioned such that the end wall 12a can engage in a space 14 between the side pillars 7a, see FIG. 2B. Upon raising of coupling unit 12, a cantilever suspended insertion system 2 is picked up by its connecting head 6, compare FIGS. 2AA and 2BB. FIG. 2A, in particular, shows a connecting head 6 having a supporting platform 6b, which head 6 is suspended by its hooked end wall 6a on pillars 7a secured to platform 7b. FIG. 2BB shows the platform 12b, and its end wall 12a, of the coupling unit 12 moving into the opening 14 and upwardly. Upon continued upward movement, the hooked end wall 6a of the connecting head 6 will be cleared from the side pillars 7a of the connecting device 7. FIG. 2C shows how the end wall 12a and the platform 12b of the coupling unit 12 already support the cantilever suspended insertion system in that the end wall is engaged with the hooked end wall 6a, so that it can carry the connecting head 6 away horizontally, along beam 11b, in a transverse movement, from the connecting device 7. It will be appreciated that the transfer of a cantilever suspended system 2 from the coupling unit 12 to any one of the connecting devices 7 takes place in the same manner, but in reverse order. Part 6a has a tapering opening 16.

It will also be apparent that an apparatus such as is described above, comprising stacked furnaces and linked with suspended loading systems, can be programmed or controlled in such a way that the suspended loading systems can be moved to and away from a substrate transfer mechanism 9 as well as into and out of furnaces in any desired sequence. Numerous other arrangements are possible within the scope of the invention described herein; the arrangement described and shown here is only one of the possible examples.

The method and the apparatus of the present invention has the following important advantages:

(a) The suspended insertion systems are very strong and stable mechanically and therefore represent a reliable transporting means, with which the very vulnerable and very expensive semiconductor substrates can be moved from one location to another, that is, from a loading station to a furnace and vice versa.

(b) A direct transfer of the substrates to magazines, which in turn are located on the suspended insertion systems, means that fewer individual raising and transferring operations are necessary, compared to the case where the substrates are transferred indirectly to the suspended insertion systems as was previously done; as a result, fewer particles (which cause contamination) are released into the surroundings.

(c) Each suspended loading system can be located exactly horizontally and level when transferring the wafers, thus facilitating the procedure.

(d) The apparatus can be designed and arranged such that it functions automatically, without requiring the presence of human operators, which would be deleterious to the clean room conditions in the vicinity of the loading station.

(e) Because the suspended loading systems are easily removed from the connecting devices 7 of the pullers, the furnaces are always readily accessible for any routine maintenance operations that may be needed.

As can be seen from the drawings, see FIGS. 2A to 2C, the end walls 12a and the side pillars 7a have their upper edges shaped to be oblique, pointing inwardly; or, respectively, have a base on their side which points outwardly towards the connecting head 6 in the lower region so that the respective end walls and/or side pillars widen towards the respective platforms of the elements in wedge-like manner.

I claim:

1. The combination of
   at least one elongated loading system having a tube insertion end, a rearward end and a connecting head located adjacent the rearward end;
   means for reciprocating the loading system into and out of at least one furnace tube (1) including
   an elongated stationary support housing (8) positioned in alignment with the at least one furnace tube,
   and a connecting device (7) releasably engageable with said connecting head (6) for supporting the loading system, in a cantilever suspended manner upon insertion into the furnace tube, with
   a common wafer transfer station (9) and with
   a transport means for transporting said at least one loading system (2) between said connecting device and said wafer transfer station, (9),
   wherein each loading system comprises
   a heat shield (5) positioned between the connecting head (6) and a semiconductor wafer (3) supporting portion, extending towards the tube receiving end (16);
   and the transport means comprises
   a stationary vertical first beam (11a) located near an end of the support housing (8) remote from the furnace tube;
   a movable horizontal second beam (11b) supported on said first beam (11a);
   electrically driven means (MV 10) for moving said second beam (11b) vertically along said first beam (11a);
   a releasable coupling unit (12) supported on said second beam (11b), and electrically driven means (MH) for moving said coupling unit (12) along said second beam, said coupling unit being selectively engageable with said connecting head (6) and thereby releasing said connecting head (6) from said connecting device (7) and transferring the connecting head (6) to said coupling unit (12),
   said coupling unit (12), upon decoupling the connecting head from the connecting device (7), supporting the loading system (2) for movement of said loading system, upon further movement of said second beam (11b) from the respective housing to said common wafer transfer station (9).

2. The combination of claim 1, wherein the connecting device (7) supports the loading system in cantilever suspended manner to remain out of contact with interior tubular side walls of the furnace tube throughout insertion of said wafers (3) into said furnace tube, treatment of said wafers (3) inside said tube and removal of said wafers from said tube, and for subsequent transport by said transport means, said coupling unit (12) supporting the loading system, upon being coupled thereto, in cantilever suspended manner.

3. The combination of claim 1, wherein the loading system includes an alignment head (13) located adjacent to and forming part of the connecting head (6) for adjustment of the inclination of the loading system (2) relative to an axis of the furnace tube.

4. The combination of claim 3, wherein the alignment head includes at least one screw element (15) for adjusting the alignment of the loading system with respect to the interior of the furnace tube.

5. The combination of claim 2, wherein the heat shield (5) is located between the alignment head (13) and the wafer supporting portion of the loading system (2) to place the alignment head and the connecting head outside of a furnace tube (1) when the loading system is introduced into a furnace tube.

6. The combination of claim 1, wherein the connecting head (6) includes a hooked part (6a);

the connecting device (7) includes at least one upstanding element (7a) engageable beneath and within said hooked part (6a);

and wherein the coupling unit (12) includes at least one upstanding element (12a) engageable beneath and within said hooked end laterally of the at least one upstanding element of the connecting device (7), and is movable vertically to lift the hooked part, and hence the connecting head and with it the loading system (2) off the at least one connecting device (7) upon transfer of the loading system (2) from the connecting device (7) to the coupling unit (12) for subsequent transfer to the common wafer transfer station (9).

7. The combination of claim 6, wherein the connecting head (6) comprises a platform (6b) and an end wall, said end wall terminating in said hooked part (6a).

8. The combination of claim 6, wherein the connecting device (7) comprises a platform (7b) and the at least one upstanding element includes two spaced pillars (7a) engageable beneath the hooked part (6a) of the connecting head;

and wherein the coupling unit (12) has a platform (12b) and an end wall dimensioned to fit within the spaced pillars (7a) so that, upon raising movement of the coupling unit (12), the end wall (12a) of the coupling unit will engage behind and within the hooked part (6a) of the connecting head (6) of the loading system, and release the connecting head from engagement with the pillars (7a) of the connecting device (7).

9. The combination of claim 8, wherein the pillars (7a) are spaced apart to define, therebetween, a window space (14) within which the end wall (12a) of the coupling unit fits.

10. The combination of claim 8, wherein, to facilitate engagement of the pillars (7a) of the connecting device (7) or the end wall (12a) of the coupling unit, the hooked part (6a) of the connecting head (6) is formed with a tapering hook opening.

11. The combination of claim 1, wherein a plurality of furnace units (1A, 1B, 1C, 1D) are provided;

a plurality of stationary support housings (8A, 8B, 8C, 8D) are provided, each located in alignment with a respective furnace tube, said furnace tubes and support housings (8) being positioned in vertically stacked arrangement;

the stationary vertical first beam (11a) extends for a distance at least spanning the maximum vertical distance between the uppermost and lowermost one of said support housings (8), and said second beam is movable, vertically, for reception or delivery of a loading system to any one of said support housings and hence any one of said furnace tubes, and transport of the loading system to or from said common wafer transfer station (9);

and wherein each of said stationary support housings (8) are provided with a connecting device (7) engageable with, and disengageable from the respective loading system.

12. The combination of a semiconductor wafer (3) treatment apparatus having a plurality of furnace tubes (1) located in a vertically aligned stack;

a plurality of cantilever suspended elongated loading systems (2) each having a support structure (4) for supporting a plurality of semiconductor wafers (3) and each having an insertion end (16) and a rear end (17), a connecting head (6) located adjacent the rear end of each loading system, and a heat shield (5) located between the connecting head and the wafer support structure (4) and shielding the connecting head from the furnace;

an elongated housing (8) extending along a first axis (M1) parallel to the major axis of each furnace tube;

means (M) for moving each of the loading systems along said housing between a treatment position in the furnace a docking position (D) outside the furnace tube (1); and a connecting device (7) connected to said moving means (M) and selectively coupling the connecting head (6) to the moving means;

a stationary wafer transfer station (9);

a transport means for transporting selected loading systems (2) between positions for engagement with said connecting device (7) and said wafer transfer station (9), said transport means comprising a stationary vertical first beam (11a) located near an end of each stationary housing (8) remote from said furnace tubes (1);

a movable horizontal second beam (11b) supported on said first beam (11a);

electrically driven means (MV 10) for moving said second beam (11b) vertically along said first beam (11a);

a coupling unit (12) supported on said second beam (11b);

electrically driven means (MH) for moving the coupling unit horizontally along the second horizontal beam;

the connecting device (7), the coupling unit (12) and the connecting head (6) having, respectively, relative configurations which permit, selectively, engagement of the connecting device (7) with the connecting head (6) or of the coupling unit (12) with the connecting head (6), and thereby releasing connection of a previously connected connecting head (6) from the connecting device (7) or engaging of a connecting head (6) with the connecting device (7) or also disengaging the connecting head (6) from the coupling unit (12), for, alternately, coupling the connecting head, and hence the loading system (2) to the connecting device (7) for movement of the loading system (2)

and the wafers into a furnace tube or decoupling the connecting head (6) from the connecting device (7), and coupling the connecting head (6) to the coupling unit (12) for movement of the loading system (2) and the wafers (3) from said docking position to said common wafer transfer station (9).

13. The combination of claim 12, wherein the connecting head (6) includes a hooked part (6a);

the connecting device (7) includes at least one upstanding element (7a) engageable beneath and within said hooked part (6a);

and wherein the coupling unit (12) includes at least one upstanding element (12a) engageable beneath and within said hooked and laterally of the at least one upstanding element of the connecting device (7), and is movable vertically to lift the hooked part, and hence the connecting head and with it the loading system (2) off the at least one connecting device (7) upon transfer of the loading system (2) from the connecting device (7) to the coupling unit (12) for subsequent transfer to the wafer transfer station (9).

* * * * *